United States Patent
Huang et al.

(10) Patent No.: US 8,797,201 B2
(45) Date of Patent: Aug. 5, 2014

(54) DRIVING CIRCUIT

(71) Applicant: Novatek Microelectronics Corp., Hsinchu (TW)

(72) Inventors: Ju-Lin Huang, Hsinchu County (TW); Jhih-Siou Cheng, New Taipei (TW); Chun-Yung Cho, Hsinchu County (TW); Chieh-An Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/925,849

(22) Filed: Jun. 25, 2013

(65) Prior Publication Data

US 2014/0139364 A1    May 22, 2014

(30) Foreign Application Priority Data

Nov. 22, 2012  (TW) .............................. 101143707 A

(51) Int. Cl.
*H03M 1/66*    (2006.01)
(52) U.S. Cl.
CPC ...................................... *H03M 1/66* (2013.01)
USPC ................. 341/144; 341/138; 345/98; 345/89
(58) Field of Classification Search
CPC ....................................................... H03M 1/66
USPC ............... 341/144, 138; 345/98, 89, 690, 211
See application file for complete search history.

(56) References Cited

U.S. PATENT DOCUMENTS

| | | | | |
|---|---|---|---|---|
| 5,719,591 | A * | 2/1998 | Callahan et al. | 345/98 |
| 6,373,478 | B1 * | 4/2002 | Steffensmeier | 345/204 |
| 6,483,522 | B1 * | 11/2002 | Chen et al. | 345/690 |
| 6,909,414 | B2 * | 6/2005 | Tsuchi et al. | 345/89 |
| 6,950,045 | B2 * | 9/2005 | Kim | 341/118 |
| 2005/0128113 | A1 * | 6/2005 | Kyung-Myun | 341/138 |
| 2011/0227891 | A1 * | 9/2011 | Lee | 345/211 |

* cited by examiner

*Primary Examiner* — Jean B Jeanglaude
(74) *Attorney, Agent, or Firm* — Jianq Chyun IP Office

(57) ABSTRACT

A driving circuit includes a plurality of reference voltage lines and a digital to analog converter. The reference voltage lines are configured for respectively transmitting different grayscale reference voltages, in which the grayscale reference voltages are divided into at least two groups, and the wire diameter/wire width of at least one reference voltage line among the reference voltage lines of a first voltage group among the at least two groups is different from the wire diameters/wire widths of the reference voltage lines of a second voltage group among the at least two groups. The digital to analog converter is coupled to the reference voltage lines to receive the grayscale reference voltages and is for converting a digital signal into a grayscale voltage according to the grayscale reference voltages.

19 Claims, 4 Drawing Sheets

DRIVING CIRCUIT

CROSS-REFERENCE TO RELATED APPLICATION

This application claims the priority benefit of Taiwan application serial no. 101143707, filed on Nov. 22, 2012. The entirety of the above-mentioned patent application is hereby incorporated by reference herein and made a part of this specification.

BACKGROUND

1. Field of the Disclosure

The disclosure generally relates to an electronic device, and more particularly, to a driving circuit.

2. Description of Related Art

In the past, in order to realize diversification of displaying grayscales with a driving integrated circuit (IC) of a display, a plurality of corresponding voltage lines in the IC are required so as to transmit different grayscale reference voltages. With the enhancement of the color grayscale resolution, the number of the required reference voltage lines is accordingly increased. To meet the need, the layout of the reference voltage lines in a conventional IC will be based on the minimum wire diameter/wire width under the available process capacity so as to achieve the layout area optimization. That is, the wire diameters/wire widths of all reference voltage lines in the conventional driving circuit are the same minimum wire diameter/wire width.

SUMMARY OF THE DISCLOSURE

Accordingly, the disclosure is directed to a driving circuit used for reducing inconsistency of transition speeds of output voltages.

An embodiment of the disclosure provides a driving circuit, which includes a plurality of reference voltage lines and a digital to analog converter. The reference voltage lines are configured for respectively transmitting different grayscale reference voltages, in which the grayscale reference voltages are divided into at least two groups, and the wire diameter/wire width of at least one reference voltage line among the reference voltage lines of a first voltage group among the at least two groups is different from the wire diameters/wire widths of the reference voltage lines of a second voltage group among the at least two groups. The digital to analog converter is coupled to the reference voltage lines to receive the grayscale reference voltages and is for converting a digital signal into a grayscale voltage according to the grayscale reference voltages.

In an embodiment of the disclosure, the driving circuit further includes a Gamma resistor string. The Gamma resistor string has a plurality of voltage-dividing nodes for dividing at least one Gamma voltage into the grayscale reference voltages, in which the voltage-dividing nodes of the Gamma resistor string are respectively and in one-by-one way coupled to the reference voltage lines to provide the grayscale reference voltages.

In an embodiment of the disclosure, the grayscale reference voltages are divided into the first voltage group and the second voltage group according to a first threshold voltage value.

In an embodiment of the disclosure, the first threshold voltage value is roughly at ¾ position of a voltage range of the grayscale reference voltages.

In an embodiment of the disclosure, all voltages among the grayscale reference voltages greater than the first threshold voltage value belong to the first voltage group, and all voltages among the grayscale reference voltages less than the first threshold voltage value belong to the second voltage group.

In an embodiment of the disclosure, the wire diameter/wire width of at least one reference voltage line among the reference voltage lines of the first voltage group is a first wire diameter/wire width, and the wire diameter/wire width of the reference voltage lines of the second voltage group is a second wire diameter/wire width less than the first wire diameter/wire width.

In an embodiment of the disclosure, all the wire diameters/wire widths of the reference voltage lines of the first voltage group are the first wire diameter/wire width and all the wire diameters/wire widths of the reference voltage lines of the second voltage group are the second wire diameter/wire width.

In an embodiment of the disclosure, the wire diameter/wire width of the other at least one reference voltage line among the reference voltage lines of the first voltage group is a third wire diameter/wire width different from the first wire diameter/wire width.

In an embodiment of the disclosure, the third wire diameter/wire width is the same as the second wire diameter/wire width.

In an embodiment of the disclosure, the first wire diameter/wire width is greater than or equal to twice as large as the second wire diameter/wire width.

In another embodiment of the disclosure, the grayscale reference voltages are divided into the first voltage group, the second voltage group and a third voltage group according to a first threshold voltage value and a second threshold voltage value, in which the first threshold voltage value is greater than the second threshold voltage value.

In another embodiment of the disclosure, the first threshold voltage value is roughly at ¾ position of a voltage range of the grayscale reference voltages and the second threshold voltage value is roughly at ¼ position of the voltage range.

In another embodiment of the disclosure, all voltages among the grayscale reference voltages greater than the first threshold voltage value belong to the first voltage group, all voltages among the grayscale reference voltages between the first threshold voltage value and the second threshold voltage value belong to the second voltage group and all voltages among the grayscale reference voltages less than the second threshold voltage value belong to the third voltage group.

In another embodiment of the disclosure, the which wire diameter/wire width of at least one reference voltage line among the reference voltage lines of the first voltage group is a first wire diameter/wire width, the wire diameter/wire width of the reference voltage lines of the second voltage group is a second wire diameter/wire width less than the first wire diameter/wire width and the wire diameter/wire width of at least one reference voltage line among the reference voltage lines of the third voltage group is a third wire diameter/wire width greater than the second wire diameter/wire width.

In another embodiment of the disclosure, all the wire diameters/wire widths of the reference voltage lines of the first voltage group are the first wire diameter/wire width, all the wire diameters/wire widths of the reference voltage lines of the second voltage group are the second wire diameter/wire width and all the wire diameters/wire widths of the reference voltage lines of the third voltage group are the third wire diameter/wire width.

In another embodiment of the disclosure, the wire diameter/wire width of the other at least one reference voltage line among the reference voltage lines of the first voltage group is a fourth wire diameter/wire width different from the first wire diameter/wire width.

In another embodiment of the disclosure, the fourth wire diameter/wire width is the same as the second wire diameter/wire width.

In another embodiment of the disclosure, the first wire diameter/wire width is greater than or equal to twice as large as the second wire diameter/wire width and the third wire diameter/wire width is greater than or equal to twice as large as the second wire diameter/wire width.

In an embodiment of the disclosure, the first wire diameter/wire width is the same as the third wire diameter/wire width.

Based on the depiction above, the disclosure provides a design of a plurality of reference voltage lines with different wire diameters/wire widths according to different ranges of grayscale reference voltages so as to effectively reduce inconsistency of transitions of output voltages.

Other objectives, features and advantages of the present invention will be further understood from the further technological features disclosed by the embodiments of the present invention wherein there are shown and described preferred embodiments of this invention, simply by way of illustration of modes best suited to carry out the invention

DESCRIPTION OF THE EMBODIMENTS

Figure 1:
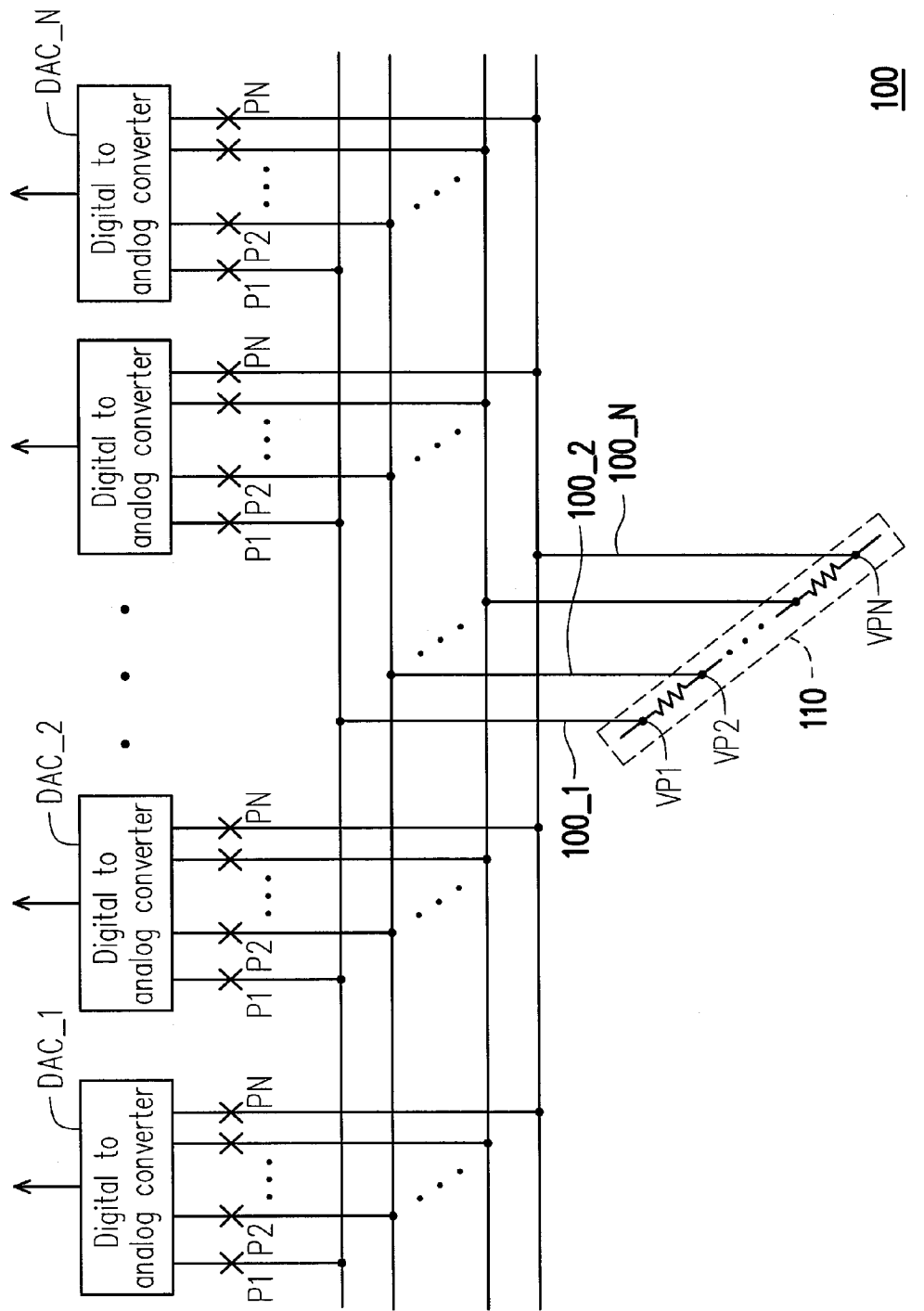
FIG. 1 is a schematic circuit diagram of a driving circuit.

FIG. 1 is a schematic circuit diagram of a driving circuit. Referring to FIG. 1, a driving circuit 100 is one of a plurality of ICs in a display device, in which the driving circuit 100 includes a Gamma resistor string 110, a plurality of reference voltage lines 100_1, 100_2, . . . , 100_N and a plurality of digital to analog converters DAC_1, DAC_2, . . . , DAC_N. Each of the digital to analog converters DAC_1-DAC_N has a plurality of input terminals P1, P2, . . . , PN for receiving different grayscale reference voltages.

Continuing to FIG. 1, the input terminals P1-PN of each of the digital to analog converters DAC_1-DAC_N are respectively coupled to the corresponding reference voltage lines 100_1-100_N. For example, the input terminal P1 of each of the digital to analog converters DAC_1-DAC_N is coupled to the same reference voltage line 100_1, the input terminal P2 of each of the digital to analog converters DAC_1-DAC_N is coupled to the same reference voltage line 100_2, and analogically for the rest, the input terminals PN of the digital to analog converters DAC_1-DAC_N are coupled to the same reference voltage line 100_N. The Gamma resistor string 110 includes a plurality of voltage-dividing nodes VP1, VP2, . . . , VPN. The voltage-dividing nodes VP1-VPN on the Gamma resistor string 110 transmit corresponding grayscale reference voltages to the input terminals P1-PN of each of the digital to analog converters DAC_1-DAC_N through corresponding reference voltage lines 100_1-100_N. For example, the voltage-dividing node VP1 on the Gamma resistor string 110 is coupled to the reference voltage line 100_1, the voltage-dividing node VP2 on the Gamma resistor string 110 is coupled to the reference voltage line 100_2, and analogically for the rest, the voltage-dividing node VPN on the Gamma resistor string 110 is coupled to the reference voltage line 100_N. In this way, the digital to analog converters DAC_1-DAC_N can receive a plurality of grayscale reference voltages produced by dividing a voltage and from the voltage-dividing nodes VP1-VPN on the Gamma resistor string 110 through the reference voltage lines 100_1-100_N. The digital to analog converters DAC_1-DAC_N can convert a digital signal into grayscale voltages according to the different grayscale reference voltages of the reference voltage lines 100_1-100_N.

However, if the wire diameters/wire widths of the reference voltage lines 100_1-100_N are the same minimum wire diameter/wire width, an inconsistency of voltage transition time occurs with the outputs of the digital to analog converters DAC_1-DAC_N.

If the transition amplitude of output voltage of the digital to analog converter is small (for example, a transition from a grayscale reference voltage V1 to the adjacent grayscale reference voltage V2), the RC delay (i.e., resistance capacitance delay) caused by the impedances of the reference voltage lines 100_1-100_N with the minimum wire diameter/wire width is small and the small RC delay can be tolerated. If the transition amplitude of output voltage of the digital to analog converter is very large, the RC delay caused by the impedances of the reference voltage lines 100_1-100_N with the minimum wire diameter may be so large that cannot be ignored. For example, when the output voltages of the digital to analog converters DAC_1-DAC_N are transited from the grayscale reference voltage V1 to the grayscale reference voltage VN, the voltage-dividing node VPN must, through a very long reference voltage line 100_N, provide the grayscale reference voltage VN to the digital to analog converters DAC_1-DAC_N, so that the output voltages of the digital to analog converters DAC_1-DAC_N can be transited to the grayscale reference voltage VN. At the time, if the wire diameter/wire width of the reference voltage line 100_N is the minimum wire diameter/wire width, the impedance of the reference voltage line 100_N will cause a so large RC delay that cannot be ignored.

Figure 2:
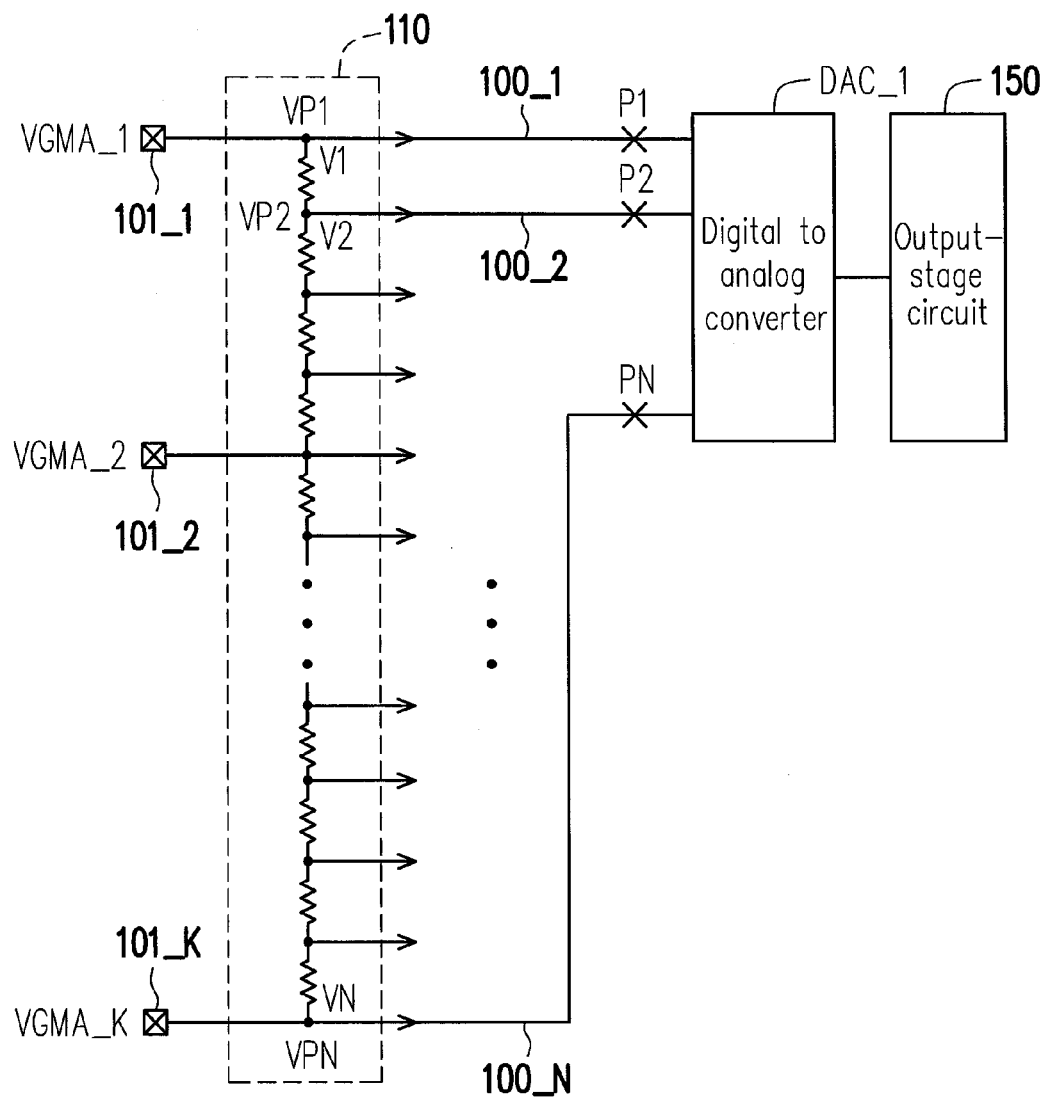
FIG. 2 is a schematic diagram of a part of the driving circuit 100 in FIG. 1.

FIG. 2 is a schematic diagram of a part of the driving circuit 100 in FIG. 1. The digital to analog converters DAC_1-DAC_N in FIG. 1 can be understood following the relevant description of the digital to analog converter DAC_1 in FIG. 2. Referring to FIG. 2, the driving circuit 100 further includes one or multiple bonding pads for receiving one or multiple Gamma voltages from the exterior of the IC. For example, the K bonding pads 101_1, 101_2, . . . , 101_K in FIG. 2 are configured to receive K Gamma voltages VGMA_1, VGMA_2, . . . , VGMA_K from the exterior of the IC. Partial voltage-dividing nodes among the voltage-dividing nodes VP1-VPN of the Gamma resistor string 110 are connected to the bonding pads 101_1-101_K for receiving the Gamma voltages VGMA_1-VGMA_K from the bonding pads 101_1-101_K. For example, the bonding pad 101_1 is coupled to the voltage-dividing node VP1 of the Gamma resistor string 110 and the bonding pad 101_K is coupled to the voltage-dividing node VPN of the Gamma resistor string 110. The voltage-dividing nodes VP1-VPN divide the Gamma voltages VGMA_1-VGMA_K to be N grayscale reference voltages V1, V2, . . . , VN.

The voltage-dividing nodes VP1-VPN of the Gamma resistor string 110 are respectively and in one-by-one way coupled to the reference voltage lines 100_1-100_N to provide the grayscale reference voltages V1-VN. The input terminals P1-PN of the digital to analog converter DAC_1 are respectively coupled to the voltage-dividing nodes VP1-VPN of the Gamma resistor string 110 through the reference voltage lines 100_1-100_N so as to receive the plurality of grayscale reference voltages V1-VN required to perform 'converting from digital signal to analog voltage' operation. For example, the input terminal P1 of the digital to analog converter DAC_1 is coupled to the voltage-dividing node VP1 through the reference voltage line 100_1 to receive the grayscale reference voltage V1, the input terminal P2 of the digital to analog converter DAC_1 is coupled to the voltage-dividing node VP2 through the reference voltage line 100_2 to receive the grayscale reference voltage V2, and analogically for the rest, the input terminal PN of the digital to analog converter DAC_1 is coupled to the voltage-dividing node VPN through the reference voltage line 100_N to receive the grayscale reference voltage VN. Then, the digital to analog converter DAC_1 is able to convert a digital signal into grayscale voltages according to the different grayscale reference voltages V1-VN of the reference voltage lines 100_1-100_N. Finally, the digital to analog converter DAC_1 can use the grayscale voltages to drive the data lines of a display panel through an output-stage circuit 150.

If the transition amplitude of output voltage of the digital to analog converter DAC_1 is very large, the RC delay caused by the impedances of the reference voltage lines 100_1-100_N may be so large that cannot be ignored. For example, when the output voltage of the digital to analog converter DAC_1 is transited from the grayscale reference voltage VN to the grayscale reference voltage V1, the voltage-dividing node VP1 must, through a very long reference voltage line 100_1, provide the grayscale reference voltage V1 to the digital to analog converter DAC_1, so that the output voltages of the digital to analog converter DAC_1 can be transited to the grayscale reference voltage V1. At the time, if the wire diameter/wire width of the reference voltage line 100_1 is increased, the impedance of the reference voltage line 100_1 can be largely reduced so as to reduce the RC delay to within an allowable margin. In this way, by widening the wire widths of the reference voltage lines corresponding to the partial grayscale reference voltages (for example, V1 or VN), the resistances R of the reference voltage lines can be effectively reduced, which accordingly reduces the equivalent time constant $\tau = R \times C$ as well (C herein represents an equivalent capacitance of the circuit). That is, by widening the wire diameters/wire widths of the reference voltage lines corresponding to the partial grayscale reference voltages, the transient response time (or RC delays) of the output voltages of the digital to analog converter DAC_1 can be reduced to within an allowable margin.

Figure 3A:
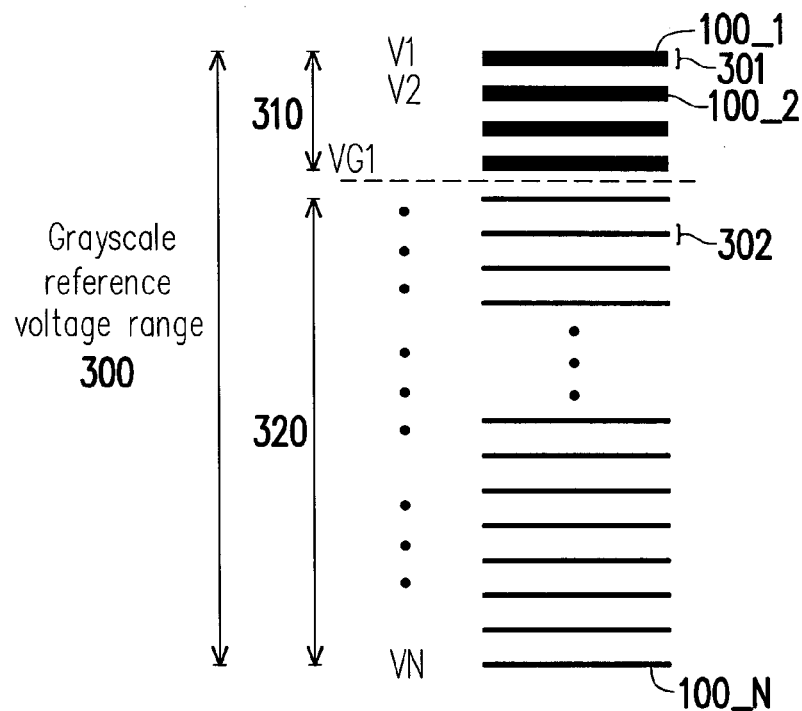
FIG. 3A is a diagram showing different wire diameters/wire widths of the reference voltage lines according to an embodiment of the disclosure.

FIG. 3A is a diagram showing different wire diameters/wire widths of the reference voltage lines according to an embodiment of the disclosure. A grayscale reference voltage range 300 contains the grayscale reference voltages V1-VN, in which the grayscale reference voltages V1-VN are divided into at least two groups according to a first threshold voltage value VG1. For example, the grayscale reference voltage range 300 can be divided into a first voltage group 310 and a second voltage group 320 by the first threshold voltage value VG1. In the embodiment, the first threshold voltage value VG1 is roughly at the ¾ position in the grayscale reference voltage range 300 as shown by FIG. 3A, which the disclosure is not limited to. For example, the first threshold voltage value VG1 can be roughly at ⅓ position in the grayscale reference voltage range 300. The reference voltage lines corresponding to the grayscale reference voltages greater than the first threshold voltage value VG1 belong to the first voltage group 310, and the reference voltage lines corresponding to the grayscale reference voltages less than the first threshold voltage value VG1 belong to the second voltage group 320.

In addition, the wire diameters/wire widths of the reference voltage lines belonging to the first voltage group 310 are different from the wire diameters/wire widths of the reference voltage lines belonging to the second voltage group 320. In the embodiment, the wire diameters/wire widths of all the reference voltage lines belonging to the first voltage group 310 are greater than or equal to twice as large as the wire diameters/wire widths of the reference voltage lines belonging to the second voltage group 320, which the disclosure is not limited to. For example, in other embodiments, the wire diameters/wire widths of all the reference voltage lines belonging to the first voltage group 310 may be 1.5 times, 3 times or other times as large as the wire diameters/wire widths of the reference voltage lines belonging to the second voltage group 320.

It should be noted that all the wire diameters/wire widths of the reference voltage lines in the first voltage group 310 are greater than the wire diameters/wire widths of the reference voltage lines of the second voltage group 320. For example, by widening all the wire diameters/wire widths of the reference voltage lines in the first voltage group 310 to a wire diameter/wire width 301, all the wire diameters/wire widths of the reference voltage lines in the second voltage group 320 are a wire diameter/wire width 302, and the wire diameter/wire width 301 is greater than the wire diameter/wire width 302 as shown by FIG. 3A. In the embodiment, the wire diameter/wire width 302 of the reference voltage lines in the second voltage group 320 can be the minimum wire diameter/wire width meeting the process requirement.

Figure 3B:
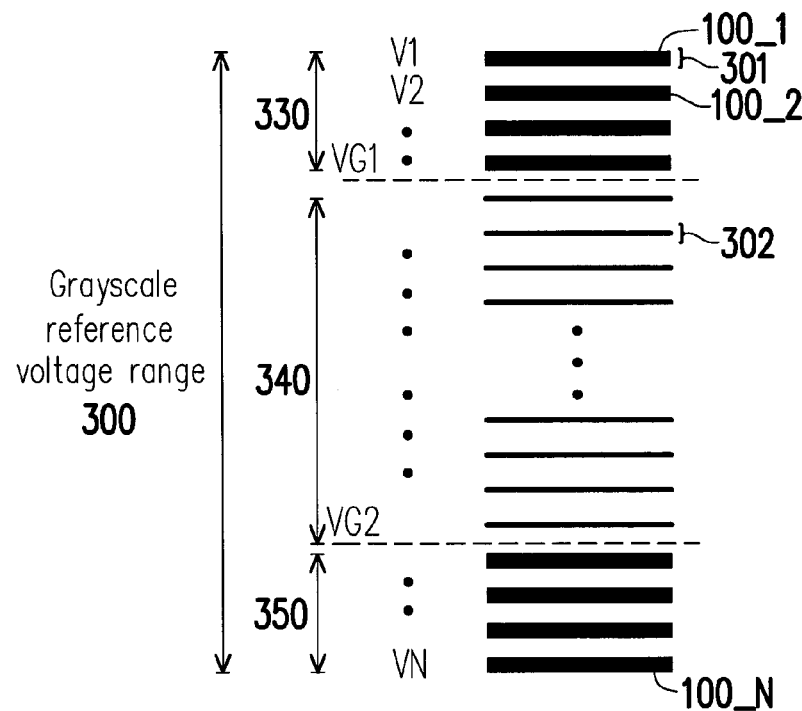
FIG. 3B is a diagram showing different wire diameters/wire widths of the reference voltage lines according to another embodiment of the disclosure.

FIG. 3B is a diagram showing different wire diameters/wire widths of the reference voltage lines according to another embodiment of the disclosure. The grayscale reference voltages V1-VN herein are divided into three groups. For example, the grayscale reference voltage range 300 can be divided into a first voltage group 330, a second voltage group 340 and a third voltage group 350 by the first threshold voltage value VG1 and the second threshold voltage value VG2. In the embodiment, the first threshold voltage value VG1 is roughly at ¾ position of the grayscale reference voltage range 300 and the second threshold voltage value VG2 is roughly at ¼ position of the grayscale reference voltage range 300, which the disclosure is not limited to. For example, the first threshold voltage value VG1 can be roughly at ⅔ position in the grayscale reference voltage range 300 and the second threshold voltage value VG2 can be roughly at ⅓ position of the grayscale reference voltage range 300. If the grayscale reference voltages received by the reference voltage lines are greater than the first threshold voltage value VG1, the reference voltage lines belong to the first voltage group 330; if the grayscale reference voltages received by the reference voltage lines are between the first threshold voltage value VG1 and the second threshold voltage value VG2, the reference voltage lines belong to the second voltage group 340; if the grayscale reference voltages received by the reference voltage lines are less than the second threshold voltage value VG2, the reference voltage lines belong to the third voltage group 350.

In addition, the wire diameters/wire widths of the reference voltage lines in the first voltage group 330 and the third voltage group 350 are different from the wire diameters/wire widths of the reference voltage lines of the second voltage group 340. In the embodiment, the wire diameters/wire widths of the reference voltage lines belonging to the first voltage group 330 and the third voltage group 350 are equal to each other and greater than or equal to twice as large as the wire diameters/wire widths of the reference voltage lines of the second voltage group 340, which the disclosure is not limited to. For example, the wire diameters/wire widths of all the reference voltage lines belonging to the first voltage group 330 and the third voltage group 350 may be 1.5 times, 3 times or other times as large as the wire diameters/wire widths of the reference voltage lines belonging to the second voltage group 340.

It should be noted that all the wire diameters/wire widths of the reference voltage lines in the first voltage group 330 and the third voltage group 350 are greater than the wire diameters/wire widths of the reference voltage lines of the second voltage group 340. For example, by widening all the wire diameters/wire widths of the reference voltage lines in the first voltage group 330 and the third voltage group 350 to the wire diameter/wire width 301, all the wire diameters/wire widths of the reference voltage lines in the second voltage group 340 are the wire diameter/wire width 302, and the wire diameter/wire width 301 is greater than the wire diameter/wire width 302 as shown by FIG. 3B. In the embodiment, the wire diameter/wire width 302 of the reference voltage lines in the second voltage group 340 can be the minimum wire diameter/wire width meeting the process requirement.

Figure 3C:
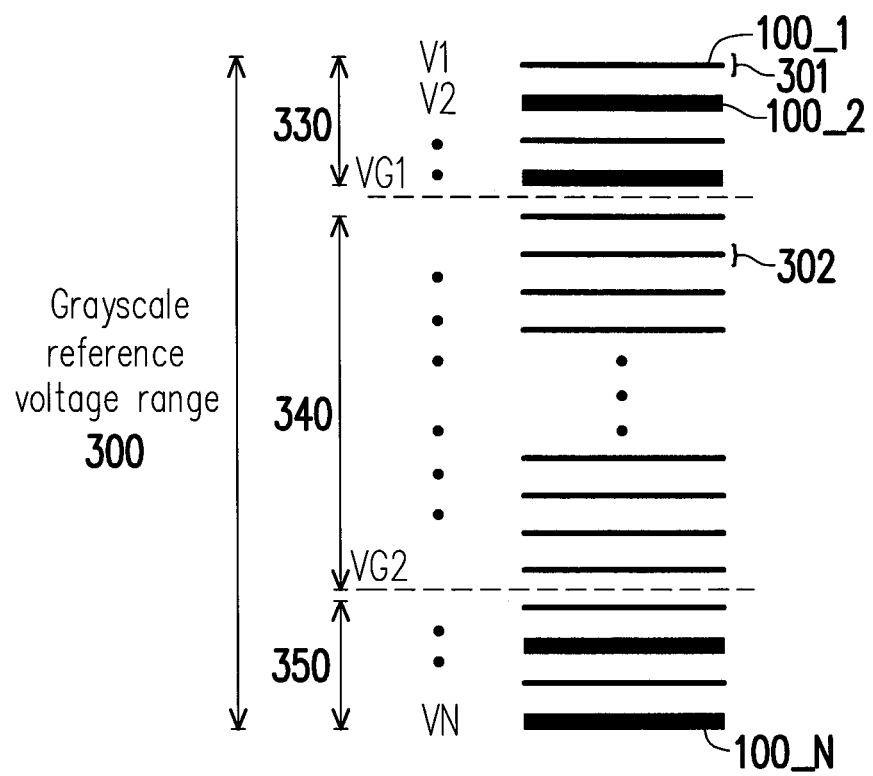
FIG. 3C is a diagram showing the distribution of different wire diameters/wire widths of the reference voltage lines according to yet another embodiment of the disclosure.

FIG. 3C is a diagram showing the distribution of different wire diameters/wire widths of the reference voltage lines according to yet another embodiment of the disclosure. The embodiment of FIG. 3C can be understood following the relevant description of the embodiment of FIG. 3B. Referring to FIGS. 3B and 3C, the grayscale reference voltage range 300 can be divided into a first voltage group 330, a second voltage group 340 and a third voltage group 350 by the first threshold voltage value VG1 and the second threshold voltage value VG2. The wire diameters/wire widths of the reference voltage lines of the second voltage group 340 are different from the partial wire diameters/wire widths of the reference voltage lines of the first voltage group 330 and the partial wire diameters/wire widths of the reference voltage lines of the third voltage group 350. In the embodiment, the wire diameter/wire width 301 of the partial reference voltage lines in the first voltage group 330 and the third voltage group 350 is greater than the wire diameter/wire width 302 of the reference voltage lines of the second voltage group 340. The wire diameters/wire widths of the rest reference voltage lines in the first voltage group 330 and the third voltage group 350 can be the same as the wire diameter/wire width 302 of the reference voltage lines in the second voltage group 340, in which the wire diameter/wire width 301 is greater than the wire diameter/wire width 302 as shown by FIG. 3C.

In summary, in the above-mentioned embodiments of the disclosure, for a plurality of reference voltage lines in different grayscale reference voltage ranges, the wire diameters/wire widths of all or partial the reference voltage lines in a predetermined grayscale reference voltage range are respectively widened. With the method, the equivalent impedance of the driving circuit is effectively reduced so as to further reduce the inconsistency of transitions of output voltages come from the driving circuit.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. It is intended that the scope of the invention is defined by the claims appended hereto.

What is claimed is:

1. A driving circuit, comprising:
   a plurality of reference voltage lines, configured for respectively transmitting different grayscale reference voltages, wherein the grayscale reference voltages are divided into at least two groups, and wire diameter/wire width of at least one reference voltage line among the reference voltage lines for transmitting a first voltage group among the at least two groups is different from wire diameters/wire widths of the reference voltage lines for transmitting a second voltage group among the at least two groups; and
   a digital to analog converter, coupled to the reference voltage lines to receive the grayscale reference voltages, and converting a digital signal into a grayscale reference voltage according to the grayscale voltages.

2. The driving circuit as claimed in claim 1, further comprising:
   a Gamma resistor string, having a plurality of voltage-dividing nodes and used for dividing at least one Gamma voltage into the grayscale reference voltages, wherein the voltage-dividing nodes of the Gamma resistor string are respectively and in one-by-one way coupled to the reference voltage lines to provide the grayscale reference voltages.

3. The driving circuit as claimed in claim 1, wherein the grayscale reference voltages are divided into the first voltage group and the second voltage group according to a first threshold voltage value.

4. The driving circuit as claimed in claim 3, wherein the first threshold voltage value is roughly at ¾ position of a voltage range of the grayscale reference voltages.

5. The driving circuit as claimed in claim 3, wherein all voltages among the grayscale reference voltages greater than the first threshold voltage value belong to the first voltage group, and all voltages among the grayscale reference voltages less than the first threshold voltage value belong to the second voltage group.

6. The driving circuit as claimed in claim 1, wherein wire diameter/wire width of at least one reference voltage line among the reference voltage lines of the first voltage group is a first wire diameter/wire width, and wire diameter/wire width of the reference voltage lines of the second voltage group is a second wire diameter/wire width less than the first wire diameter/wire width.

7. The driving circuit as claimed in claim 6, wherein all the wire diameters/wire widths of the reference voltage lines of the first voltage group are the first wire diameter/wire width, and all the wire diameters/wire widths of the reference voltage lines of the second voltage group are the second wire diameter/wire width.

8. The driving circuit as claimed in claim 6, wherein wire diameter/wire width of the other at least one reference voltage line among the reference voltage lines of the first voltage group is a third wire diameter/wire width different from the first wire diameter/wire width.

9. The driving circuit as claimed in claim 8, wherein the third wire diameter/wire width is the same as the second wire diameter/wire width.

10. The driving circuit as claimed in claim 6, wherein the first wire diameter/wire width is greater than or equal to twice as large as the second wire diameter/wire width.

11. The driving circuit as claimed in claim 1, wherein the grayscale reference voltages are divided into the first voltage group, the second voltage group and a third voltage group according to a first threshold voltage value and a second threshold voltage value, wherein the first threshold voltage value is greater than the second threshold voltage value.

12. The driving circuit as claimed in claim 11, wherein the first threshold voltage value is roughly at ¾ position of a voltage range of the grayscale reference voltages, and the second threshold voltage value is roughly at ¼ position of the voltage range.

13. The driving circuit as claimed in claim 11, wherein all voltages among the grayscale reference voltages greater than the first threshold voltage value belong to the first voltage group, all voltages among the grayscale reference voltages between the first threshold voltage value and the second threshold voltage value belong to the second voltage group, and all voltages among the grayscale reference voltages less than the second threshold voltage value belong to the third voltage group.

14. The driving circuit as claimed in claim 11, wherein wire diameter/wire width of at least one reference voltage line among the reference voltage lines of the first voltage group is a first wire diameter/wire width, wire diameter/wire width of the reference voltage lines of the second voltage group is a second wire diameter/wire width less than the first wire diameter/wire width, and wire diameter/wire width of at least one reference voltage line among the reference voltage lines of the third voltage group is a third wire diameter/wire width greater than the second wire diameter/wire width.

15. The driving circuit as claimed in claim 14, wherein all the wire diameters/wire widths of the reference voltage lines of the first voltage group are the first wire diameter/wire width, all the wire diameters/wire widths of the reference voltage lines of the second voltage group are the second wire diameter/wire width, and all the wire diameters/wire widths of the reference voltage lines of the third voltage group are the third wire diameter/wire width.

16. The driving circuit as claimed in claim 14, wherein wire diameter/wire width of the other at least one reference voltage line among the reference voltage lines of the first voltage group is a fourth wire diameter/wire width different from the first wire diameter/wire width.

17. The driving circuit as claimed in claim 16, wherein the fourth wire diameter/wire width is the same as the second wire diameter/wire width.

18. The driving circuit as claimed in claim 14, wherein the first wire diameter/wire width is greater than or equal to twice as large as the second wire diameter/wire width, and the third wire diameter/wire width is greater than or equal to twice as large as the second wire diameter/wire width.

19. The driving circuit as claimed in claim 14, wherein the first wire diameter/wire width is the same as the third wire diameter/wire width.

\* \* \* \* \*